(12) United States Patent
Arsovski et al.

(10) Patent No.: US 10,839,931 B2
(45) Date of Patent: Nov. 17, 2020

(54) ZERO TEST TIME MEMORY USING BACKGROUND BUILT-IN SELF-TEST

(71) Applicant: MARVELL INTERNATIONAL LTD., Hamilton (BM)

(72) Inventors: Igor Arsovski, Williston, VT (US); Eric D. Hunt-Schroeder, Essex Junction, VT (US); Michael A. Ziegerhofer, Jeffersonville, VT (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/520,642

(22) Filed: Jul. 24, 2019

(65) Prior Publication Data

US 2019/0348137 A1 Nov. 14, 2019

Related U.S. Application Data

(62) Division of application No. 15/478,666, filed on Apr. 4, 2017, now Pat. No. 10,438,678.

(51) Int. Cl.
| | |
|---|---|
| *G11C 29/00* | (2006.01) |
| *G11C 29/12* | (2006.01) |
| *G06F 12/1027* | (2016.01) |
| *G11C 8/16* | (2006.01) |
| *G11C 29/04* | (2006.01) |

(52) U.S. Cl.
CPC .......... *G11C 29/12* (2013.01); *G06F 12/1027* (2013.01); *G11C 8/16* (2013.01); *G06F 2212/65* (2013.01); *G06F 2212/68* (2013.01); *G11C 2029/0409* (2013.01)

(58) Field of Classification Search
CPC ... G11C 29/12; G11C 8/16; G11C 2029/0409; G06F 12/1027; G06F 2212/65; G06F 2212/68
See application file for complete search history.

(56) References Cited

U.S. PATENT DOCUMENTS

| | | |
|---|---|---|
| 5,681,358 A | 10/1997 | Spencer et al. |
| 5,812,469 A | 9/1998 | Nadeau-Dostie et al. |
| 7,216,277 B1 | 5/2007 | Ngai et al. |
| 9,208,024 B2 | 12/2015 | Pelley et al. |
| 9,304,854 B2 | 4/2016 | Moon et al. |
| 9,361,196 B2 | 6/2016 | Kleveland et al. |
| 9,449,717 B2 | 9/2016 | Becker et al. |
| 2006/0156212 A1* | 7/2006 | Kikutake ............... G11C 29/10 714/800 |
| 2013/0173970 A1 | 7/2013 | Kleveland et al. |
| 2014/0019823 A1* | 1/2014 | Ramirez ............... G06F 1/3296 714/755 |
| 2016/0110249 A1* | 4/2016 | Orme ................ G06F 11/1016 714/6.24 |

* cited by examiner

*Primary Examiner* — Christine T. Tu

(57) ABSTRACT

The present disclosure relates to a structure which includes a memory which is configured to enable zero test time built-in self-test (BIST) at a read/write port while concurrently performing at least one functional read operation at a read port.

14 Claims, 5 Drawing Sheets

ZERO TEST TIME MEMORY USING BACKGROUND BUILT-IN SELF-TEST

CROSS-REFERENCE TO RELATED APPLICATIONS

The present application is a divisional of U.S. patent application Ser. No. 15/478,666 (now U.S. Pat. No. 10,438,678) filed on Apr. 4, 2017.

FIELD OF THE INVENTION

The present disclosure relates to providing a zero test time memory which uses a built-in self-test, and more particularly, to a multi-port memory to allow for zero test time for the multi-port memory while performing functional operations.

BACKGROUND

In industrial applications (e.g., automotive), a company may want to take an advanced reduction instruction set computer machine (i.e., ARM) core out of a mission mode (i.e., functional operations) and into a test mode, while maintaining the remaining ARM cores and a level 2 (L2) cache in the mission mode. Further, in many industrial applications (e.g., automotive), the electronic circuits need to be continuously tested in order to ensure reliability and prevent software and/or hardware faults that may cause system downtime. Thus, in these industrial applications, there is a need for memory to be concurrently tested while functional operations are performed.

In an example of the automotive industry, a 200 millisecond (msec) cycle is needed to perform on-chip testing. In this scenario, a functional operation is issued, which is then followed by a test operation of the logic block. In this scenario, as it is hard to provide large blocks of contiguous test time, slow performance can result because no further functional operations can be issued until after the testing is complete.

SUMMARY

In an aspect of the disclosure, a structure includes a memory which is configured to enable zero test time built-in self-test (BIST) at a read/write port while concurrently performing at least one functional read operation at a read port.

In another aspect of the disclosure, a method includes performing at least one functional read operation at a first read port, and performing zero test time built-in self-test (BIST) at a second read port while concurrently performing the at least one functional read operation at the first read port.

In another aspect of the disclosure, a method includes performing a functional write operation, updating data of a test storage cache (TSC) when the functional write operation collides with a word under test (WUT), and performing a testing idle cycle when there is no collision between the functional write operation and the WUT.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
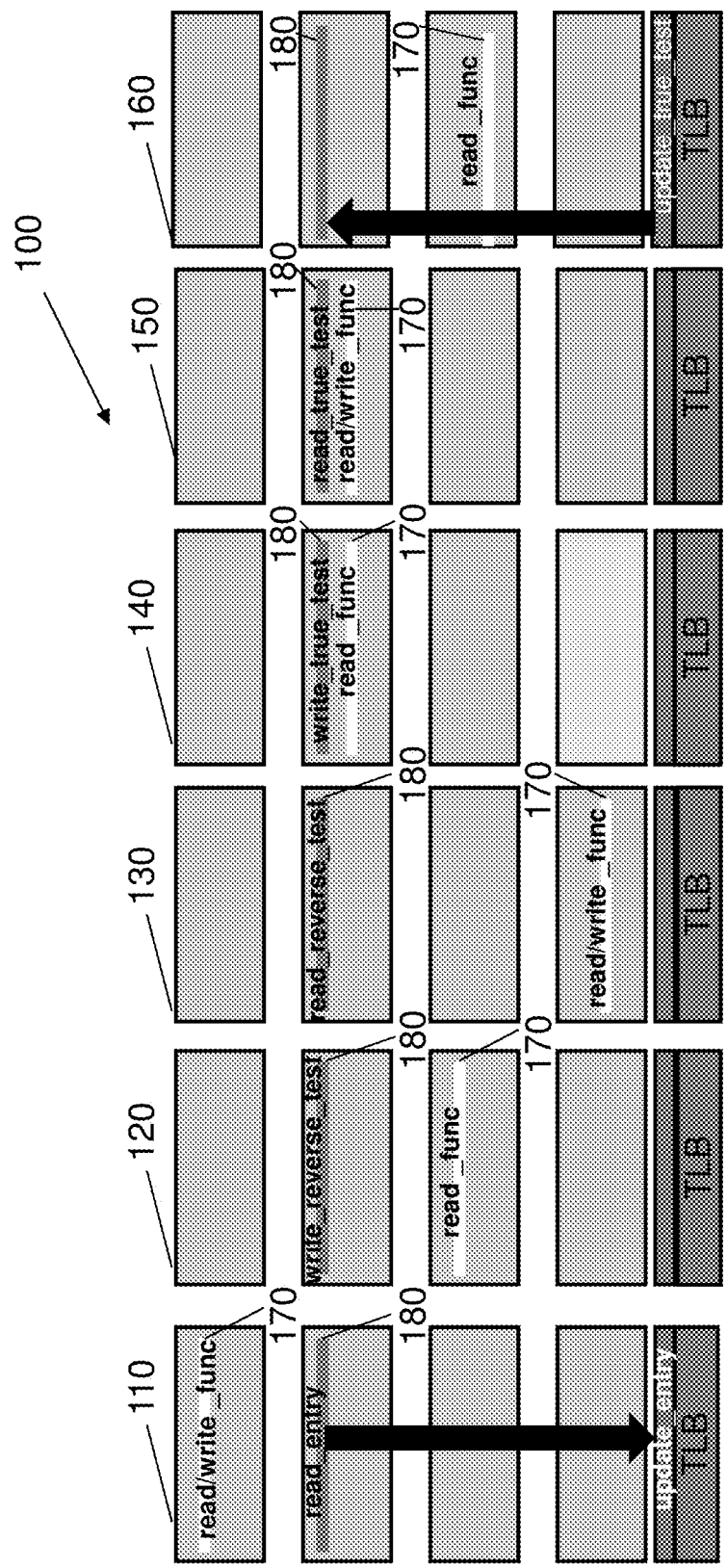
FIG. 1 shows a zero-test approach over multiple cycles in accordance with aspects of the present disclosure.

The present disclosure relates to providing a zero test time memory which uses a built-in self-test, and more particularly, to a multi-port memory to allow for zero test time for the multi-port memory while performing functional operations. In more specific embodiments, a multi-port memory (i.e., an N-port memory with N>1) is provided with one port dedicated to testing of the memory with the built-in self-test while at least one other port can be dedicated to performing functional operations (i.e., customer operations). Advantageously, by implementing the multi-port memory, a zero test time is provided for the built-in self-test for continuous functional (i.e., customer) transparent testing. Also, for a customer that only requires one port to perform functional operations, continuous and concurrent testing can be performed with no impact to functional operations. In contrast, in known memory systems, testing has to be performed during a cycle in which no functional operations are performed (i.e., no functional operation cycle), which slows down performance.

In embodiments, a structure which includes a memory is configured to enable zero test time built-in self-test (BIST) during at least one functional operation to continuously test hardware, and a wrapper which is configured to interface with the memory to continually test the hardware, which includes a plurality of hardware logic. The structure may also include a test storage cache (TSC) which is a hardware storage cache. In further embodiments, the TSC is a hardware implementation which holds memory data while the address is under test. The memory is further configured to determine a word under test (WUT) and read data of the WUT. The plurality of hardware logic of the wrapper includes a translation lookaside buffer (TLB) which is configured to point the WUT to the TSC for at least one functional operation. The TLB is a hardware memory cache that stores recent translations of virtual memory to physical addresses for faster memory retrieval.

The TSC is configured to receive the data of the WUT from the memory, verify the data of the WUT, and perform the at least one functional operation of the WUT after the WUT has been pointed to the TSC. The memory is further configured to perform the BIST with at least one pattern. The at least one pattern includes one of a checkerboard and a reverse checkerboard, as examples. The TSC is further configured to write back the data of the WUT and verify the data of the write back. The TLB is further configured to remove the point to allow direct address mapping to the WUT.

In an illustrative non-limiting example, the multi-port memory can utilize a two-port static random access memory (SRAM) and other similar configurations. One port of the SRAM can be used for customer/functional operations, such as a read or write operation, and the other port of the SRAM can be used for concurrent testing. For example, in implementation, a word under test (WUT) can be determined and then transferred to a TSC. Then, a mapping operation is performed for a TLB to point the WUT to the TSC. All WUT operations can be routed to the TSC. After testing is accomplished, there is a transfer of the TSC to the WUT. The TLB pointer is then removed, which allows direct address mapping to the word under test (WUT). The word under test (WUT) is then incremented, and the process is repeated for the remaining words.

As should now be understood, in embodiments of the present disclosure, by implementing a multi-port memory of the embodiments, a zero test time is provided for the built-in self-test for continuous functional (i.e., customer) transparent testing. Further, in embodiments, for a customer that only requires one port to perform functional operations, continuous and concurrent testing can be performed with no impact to functional operations. For example, the multi-port memory can include a 2 read port/1 write port configuration to have a shared write operation between functional operations and testing operations. Further, the multi-port memory can include other configurations, such as a 4 read port/2 write port configuration to share write operations between functional operations and testing operations.

FIG. 1 shows a zero-test approach over multiple cycles in accordance with aspects of the present disclosure. FIG. 1 includes a two-port design, with the first port being a port for functional operations and the second port being port for testing operations. In FIG. 1, the zero-test approach 100 is shown with multiple cycles, including a first cycle 110, a second cycle 120, a third cycle 130, a fourth cycle 140, a fifth cycle 150, and a sixth cycle 160. Further, in FIG. 1, a rectangle 170 corresponds to a first port (e.g., a functional operation port) and a rectangle 180 corresponds to a second port (e.g., a test port). In the zero-test approach 100, a first cycle 110 includes a read/write function (e.g., read/write_func) which is performed at a first port (e.g., a functional operation port). In the first cycle 110, a read entry (e.g., read_entry) can occur on a second port (e.g., a test port). Further, in the first cycle 100, a word (i.e., data) may be copied to a test buffer (e.g., a test storage cache (TSC)), which is referenced as update_entry. A translation lookaside buffer (TLB) is then mapped to point the word (i.e., data) to the TSC.

In FIG. 1, in the second cycle 120, a test word is written at a next available write idle cycle to a complement (i.e., write_reverse_test) of the word (i.e., data) in the first cycle 110. In the second cycle 120, the test word is written at the second port (e.g., the test port). Further, in the second cycle 120, a read function (e.g., read_func) can be performed at the first port (e.g., the functional operation port). In the third cycle 130, a read and test (e.g., read_reverse_test) is performed to see if the complement of the word (i.e., data) can be read successfully. In the third cycle 130, the read and test is performed at the second port (e.g., the test port). In the third cycle 130, a read/write function (e.g., read/write_func) is performed at the first port (e.g., the functional operation port).

Still referring to FIG. 1, in the fourth cycle 140, a test word is written at a next available write idle cycle (i.e., write_true_test) to the word (i.e., data). The test word is written at the second port (e.g., the test port). Also, a read function (e.g., read_func) can be performed at the first port (e.g., the functional operation port). In the fifth cycle 150, a read and test (e.g., read_true_test) is performed to see if the word (i.e., data) was read successfully. In the fifth cycle 150, the read and test is performed at the second port (e.g., the test port). Further, in the fifth cycle 150, a read/write function (e.g., read/write_func) is performed at the first port (e.g., the functional operation port).

In FIG. 1, in the sixth cycle 160, the word (i.e., the data) in the translation lookaside buffer (TLB) is moved back to the tested word at the second part (e.g., the test port), which is referenced as update_true_test. Further, in the sixth cycle 160, a read function (e.g., read_func) is performed at the first port (e.g., the functional operation port). After the sixth cycle 160, the process is repeated and another word is tested.

Figure 2:
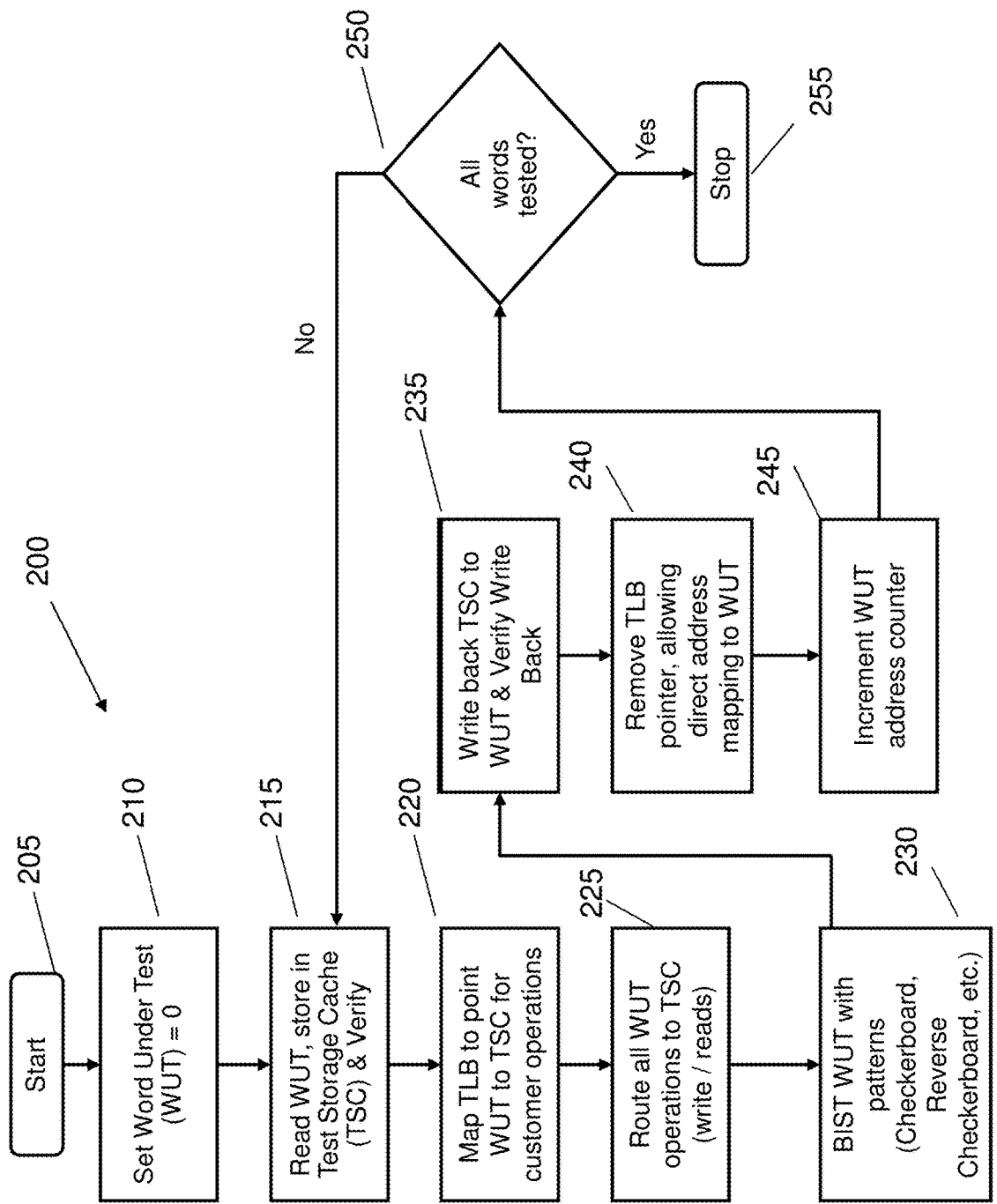
FIG. 2 shows a method of the zero-test approach in accordance with aspects of the present disclosure.

Referring to FIG. 2, a method includes reading data of a word under test (WUT) and storing the data of the WUT in a TSC, mapping a TLB to point the WUT to the TSC, routing a plurality of WUT operations to the TSC, and testing the WUT with at least one pattern. The method further includes writing back the data of the WUT in the TSC to the WUT. The method further includes removing the point of the TLB to allow direct address mapping the WUT. The method further includes incrementing a word address counter to test another word. The method further includes verifying the data of the WUT in the TSC. The plurality of WUT operations includes at least one functional operation. The at least one functional operation is a write operation. The at least one functional operation is a read operation.

More specifically, in FIG. 2, the flow 200 for a zero-test approach starts at step 205. At step 210, a WUT is set to zero (i.e., "0"). At step 215, the WUT is read, stored in a TSC, and then verified. At step 220, a TLB is mapped to point the WUT to the TSC for customer (i.e., functional) operations. At step 225, all customer (i.e. functional) WUT operations (e.g., write/reads) are routed to the TSC. Then, at step 230, a built-in self-test word under test (BIST WUT) is tested with patterns (e.g., checkerboard, reverse checkerboard, etc.). At step 235, the contents of the TSC are written back to the WUT and then the written back information is verified. At step 240, the TLB pointer is removed, which allows for direct address mapping to the WUT.

At step 245, the WUT address counter is incremented to test another word. Then, at step 250, a determination is made if all words in the memory have been tested. If all words have been tested, the method ends at step 255. However, if all words have not been tested in the memory, the method returns to step 215 and the method is repeated from steps 215 to step 250 until all words in the memory have been tested.

Figure 3:
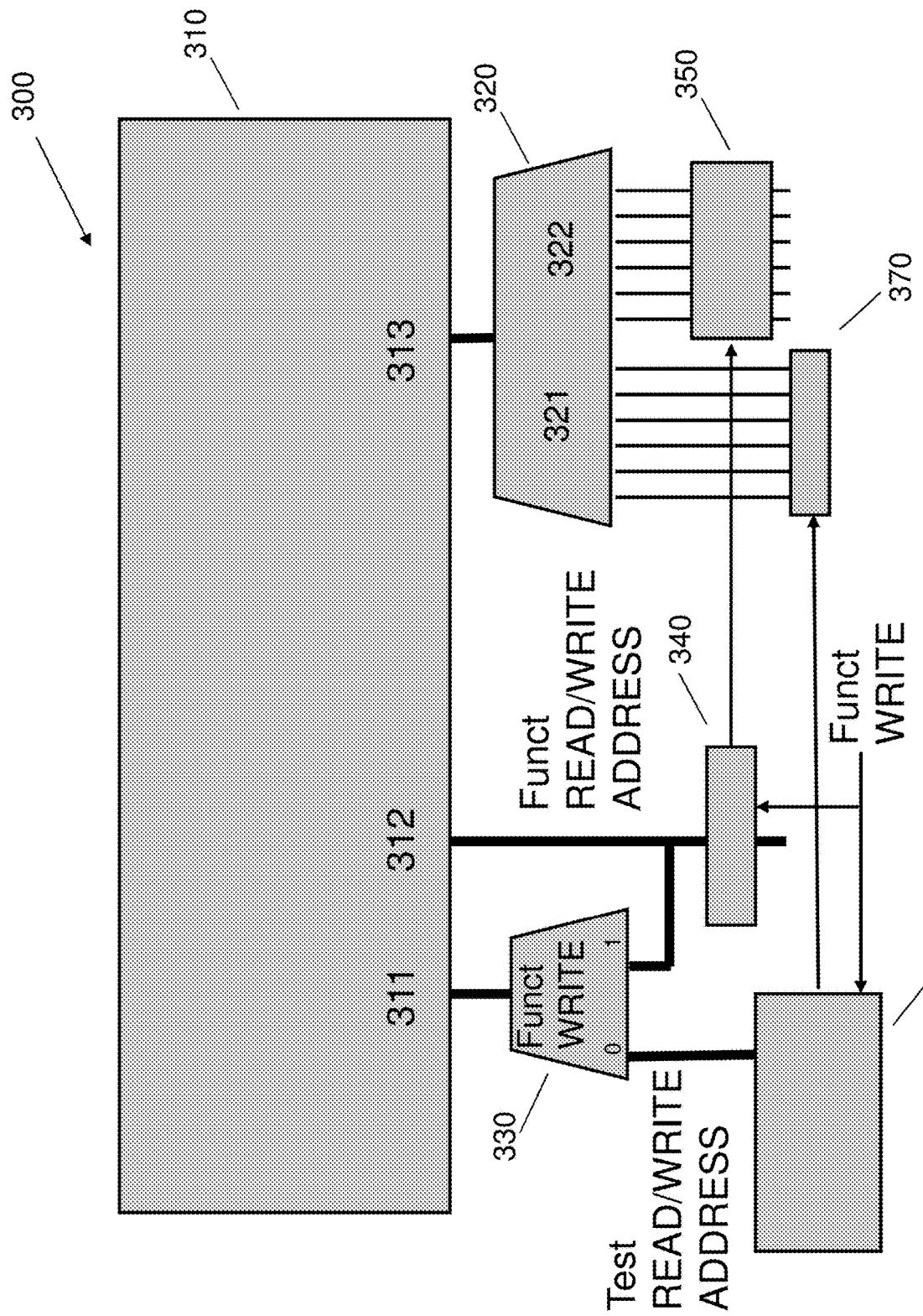
FIG. 3 shows a high level test wrapper in accordance with aspects of the present disclosure.

FIG. 3 shows a high level test wrapper implemented in hardware for providing a zero-test time memory. In embodiments, the high level test wrapper 300 can occupy a small area/size and have a lower hardware complexity (i.e., similar to one port memory configuration) in comparison to configuration with multiple write ports, with a tradeoff of slower performance when the customer is writing. In an example, the high level test wrapper can include a hardware wrapper, a multi-port memory, a WUT, and a TSC. The hardware wrapper can include standard state logic and registers, which can further include, e.g., test registers, TLB, etc. Further, the WUT can be a full physical word which can be tested at a single time or multiple adjacent words which can be tested at a same time to ensure there are no conflicts between adjacent cells. In embodiments, the TSC has a quantity which is equal to a decode multiplied by the input/output width (i.e., IO_WIDTH). Further, in embodiments, the TSC includes a first port which includes customer (i.e., functional) addresses (e.g., an "A port") and a second port which includes test addresses (e.g., a "B port"). Therefore, in the TSC, there are dedicated read ports, with one port for functional operations and one for testing operations in a built-in self-test (BIST). Thus, in the embodiments, the TSC allows for concurrent function and test reads. However, in the TSC, write operations need to be shared by functional (i.e., customer) operations and testing operations in a built-in self-test (BIST).

More specifically, in FIG. 3, the high level test wrapper 300 includes a static random access memory (SRAM) 310, a first multiplexer (MUX) 320, a second MUX 330, a TLB 340, a TSC 350, a BIST finite state machine (FSM) 360, and a BIST device 370. The SRAM 310 includes a test read/write port (i.e., test RW port)/functional write port (i.e., Func W port) 311, a functional read port (i.e., Func R port) 312, and a data input/output 313. The data input/output 313 further includes two read ports/one write port. Further, the first MUX 320 contains test data input/output 321 and functional data input/output (i.e., Func D I/O) 322.

In operation, when the second MUX 330 receives an assertion of functional write (i.e., Funct Write="1"), the second MUX 330 will select the path that allows for functional read/write addressing to occur (i.e., Funct Read/Write Address). Therefore, the path that allows for test read/write addressing is not selected, and testing does not occur. For example, if a customer is writing data (i.e., performing a functional write), no testing (i.e., either reading or writing in test operations) would occur because there is only one port for writing (i.e., Test RW port/Func W port). Accordingly, when a functional write is asserted (i.e., Funct Write="1"), testing stops.

In FIG. 3, when a function write is not asserted (i.e., Funct Write="0"), then testing can occur. Specifically, when the second MUX 330 receives a non-assertion of functional write (i.e., Funct Write="0"), the second MUX 330 will select the path that allows for test read/write addressing to occur (i.e., Test Read/Write Address). Therefore, the path allows for test read/write addressing, and testing occurs using the BIST FSM 360 and the BIST device 370. For example, when functional write is not asserted (i.e., not performing a functional write), testing operations (i.e., either reading or writing in test operations) can occur because the customer is not writing and the one port (i.e., Test RW port/Func W port) is available for testing.

Figure 4:
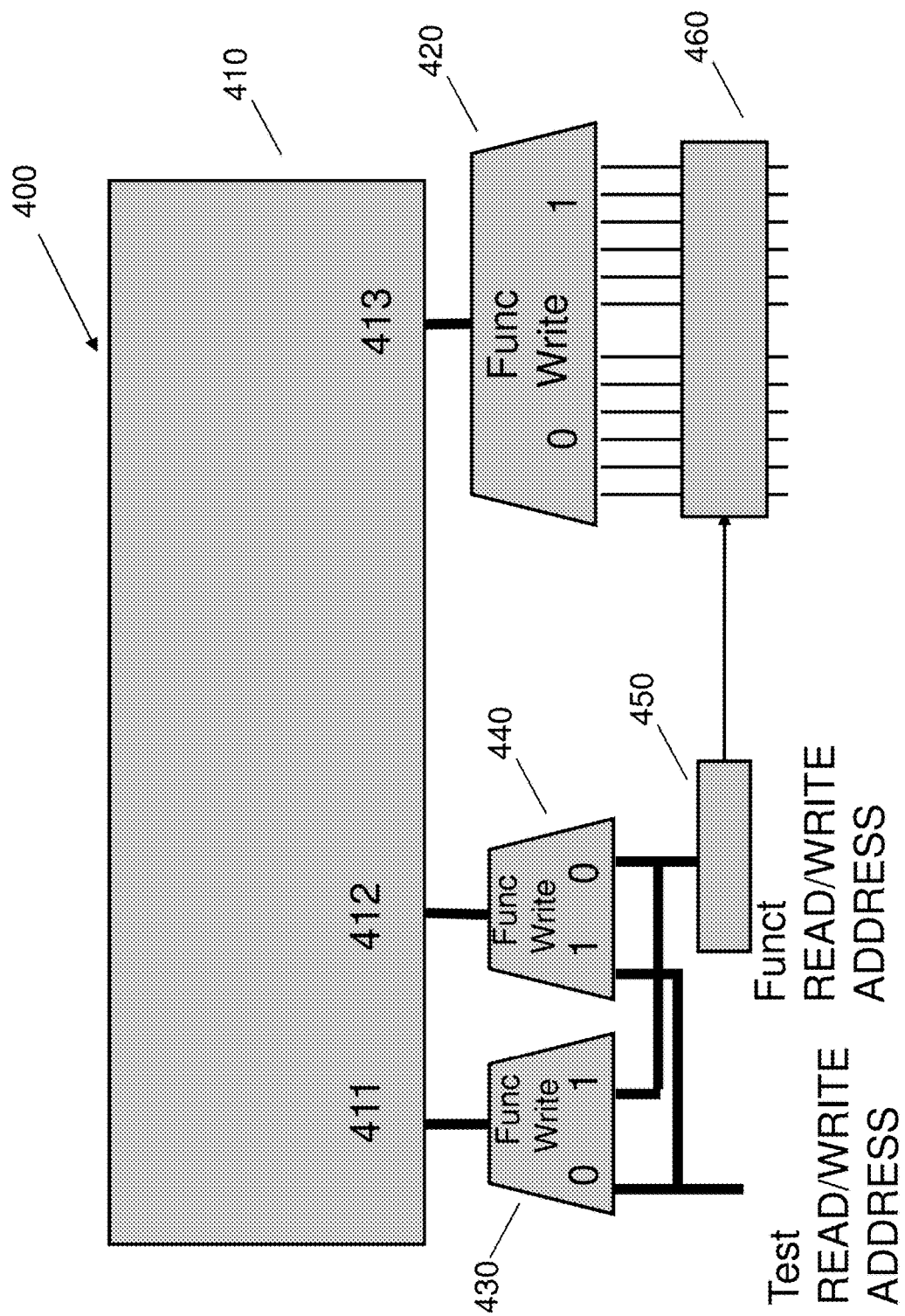
FIG. 4 shows another high level test wrapper in accordance with aspects of the present disclosure.

FIG. 4 shows another high level test wrapper (i.e., high level test wrapper 400) in accordance with aspects of the present disclosure. In FIG. 4, the high level test wrapper 400 includes a static random access memory (SRAM) 410, a first multiplexer (MUX) 420, a second MUX 430, a third MUX 440, a TLB 450, and a TSC 460. The SRAM 410 includes a test read/write port (i.e., Test RW port)/functional write port (i.e., Func W port) 411, a functional read port (i.e., Func R port) 412, and a data input (i.e., DIN) 413. In FIG. 4, the high level test wrapper 400 can occupy a larger area/size and have a higher hardware complexity in comparison to configurations with a single write port, with a tradeoff of faster performance when the customer is writing.

In operation, when a functional write is asserted (i.e., Func Write="1"), only writing test operations are stopped. In other words, when the second MUX 430 and the third MUX 440 receives an assertion of functional write (i.e., Func Write="1"), the second MUX 430 and the third MUX 440 will select the path that allows for functional read/write addressing to occur (i.e., Funct Read/Write Address) and testing read operations to occur (i.e., Test Read Address). Therefore, the path that allows for test write addressing is not selected, and write testing operations do not occur. For example, if a customer is writing data (i.e., performing a functional write), read testing can occur, but no write testing can occur (i.e., customer/functional writes take priority over write testing).

On the other hand, when a functional write is not asserted (i.e., Func Write="0"), then both reading and writing test operations can occur. In other words, when the second MUX 430 and the third MUX 440 receive a non-assertion of a functional write (i.e., Func Write="0"), the second MUX 430 and the third MUX 440 will select the path that allows for a functional read addressing to occur (i.e., Funct Read Address) and testing operations (i.e., either reading or writing in test operations) to occur (i.e., Test Read/Write Address). Therefore, the path allows for test read/write addressing. For example, when functional write is not asserted (i.e., not performing a functional write), testing operations (i.e., either reading or writing in test operations) can occur because the customer is not writing and the one port (i.e., Test RW port/Func W port) is available for testing.

In embodiments of the zero-test memory described in FIGS. 3 and 4, during handling of collisions of customer write operations, customer (i.e., functional) writes always take priority over test operations. Further, concurrently when a customer writes in a WUT, the writes occurring in the WUT during the transfer of data from the WUT to the TSC or during the transfer of data from the TSC to the WUT, a write operation to both addresses is required. Further, a write to the WUT during the test of the WUT would only update the TSC.

In further embodiments of the zero-test memory described in FIGS. 3 and 4, the second port is used when a customer reads in the WUT, customer read operations to the WUT during the transfer of data from the WUT to the TSC. Further, a read to the WUT occurs during test, and a read of data in the TSC is performed. Further, handling collisions (i.e., data interferences when performing different operations) of customer write operations requires a guarantee of enough free write cycles (i.e., only one write port is available) to ensure enough write cycles for the test operations. In typical memory operations, 90% of operations are read operations.

Figure 5:
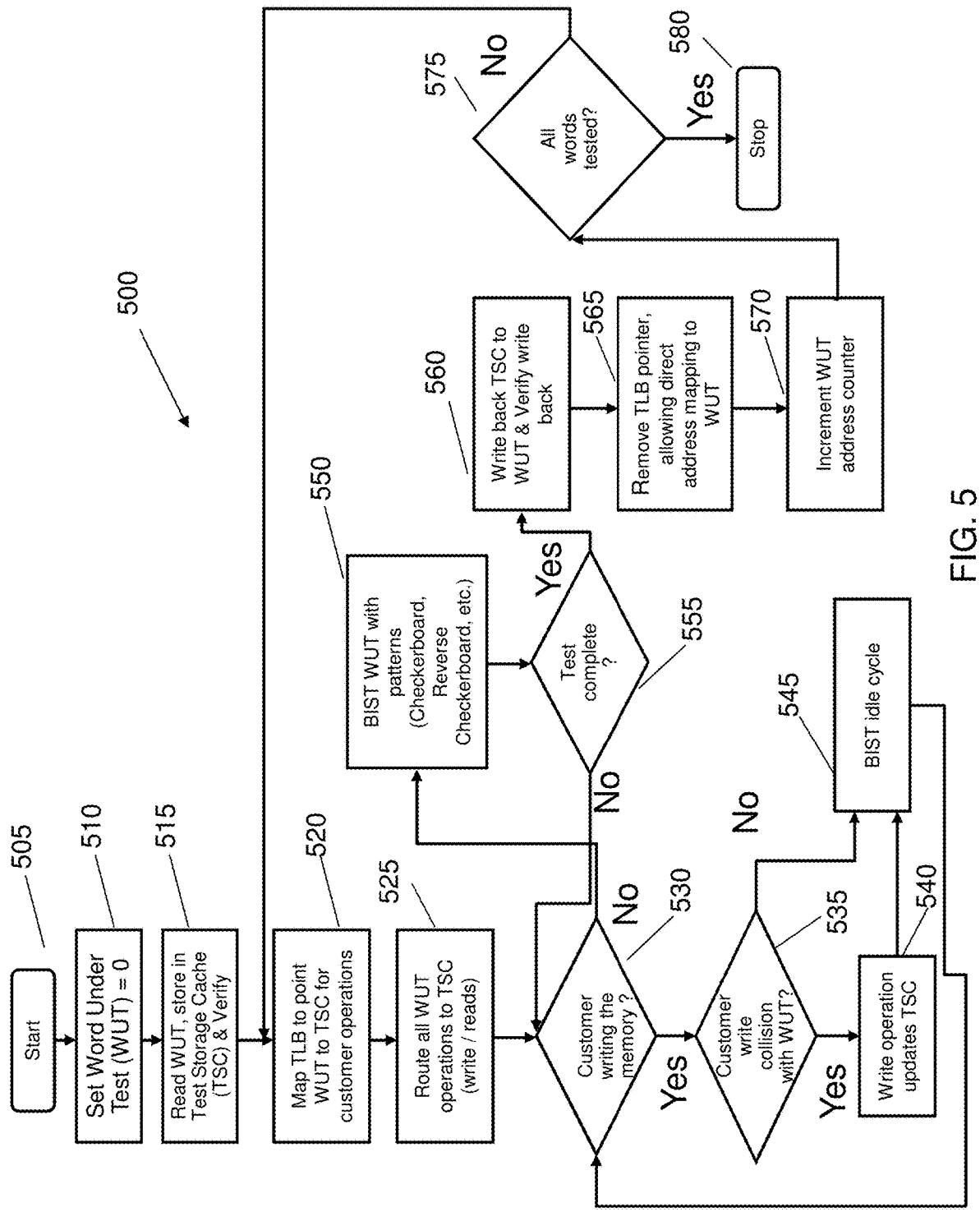
FIG. 5 shows a method of performing the high level test wrappers in accordance with aspects of the present disclosure.

FIG. 5 shows a method of performing the high level test wrappers. The method includes reading data of a WUT and storing the data of the WUT in a TSC. The method also maps a TLB to point the WUT to the TSC and routes a plurality of WUT operations to the TSC. Then, a functional write operation is performed. Data of the TSC is updated based on the functional write operation when the functional write operation collides with the WUT. A testing idle cycle is performed in response to the functional write operation not colliding with the WUT. The method further includes writing back the data of the WUT in the TSC to the WUT. The method also includes removing the point of the TLB to allow direct address mapping to the WUT.

More specifically, FIG. 5 shows a flowchart 500 including a method of performing the high level test wrappers described in FIGS. 3 and 4 in accordance with aspects of the present disclosure. In FIG. 5, the method starts at step 505. At step 510, the word under test (WUT) is set to zero (i.e., "0"). At step 515, the word under test (WUT) is read, stored in a test storage cache (TSC), and then verified. At step 520, a translation lookaside buffer (TLB) is mapped to point the word under test (WUT) to the test storage cache (TSC) for customer (i.e., functional) operations. At step 525, all word under test (WUT) operations (i.e., read/write operations) are routed to the test storage cache (TSC).

At step 530, a determination is made as to whether a write operation is being performed to a memory. If not performing a write operation to the memory (i.e., "No" at step 530), then the method goes to step 550. Otherwise, if there is a write operation being performed to the memory (i.e., "Yes" at step 530), then the method moves to step 535. At step 535, a determination is made as to whether the write has a collision with the WUT. If the write has a collision with the WUT (i.e., "Yes" at step 535), then the write operation updates the TSC at step 540 and the method moves to step 545. In contrast, if the write does not have a collision with the WUT (i.e., "No" at step 535), then the method moves directly to step 545. At step 545, a built-in self-test (BIST) idle cycle is performed and the method moves back to step 535 where it is determined whether the customer is performing a write operation to the memory.

At step 550, a built-in self-test word under test (BIST WUT) is tested with patterns (i.e., checkerboard, reverse checkerboard, etc.). At step 555, a determination is made as to whether the test is complete. If the test is not complete (i.e., "No" at step 555), then the method moves back to step 530. If the test is complete (i.e., "Yes" at step 555), then the method moves to step 560.

At step 560, the contents of data at the TSC are written back to the WUT and then there is a verification of the written back information. At step 565, the TLB pointer is removed, which allows direct address mapping to the WUT. At step 570, the WUT address counter is incremented. At step 575, a determination is made as to whether all words have been tested. If all words in the memory have been tested (i.e., "Yes" at step 575), then the method ends at step 580. If all words in the memory have not been tested (i.e., "No" at step 575), then the method returns to step 520 and the method is repeated from steps 520 to step 575 until all words in the memory have been tested.

The circuit and method for a zero test time memory using background built-in self-test of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a zero test time memory using background built-in self-test of the present disclosure has been adopted from integrated circuit (IC) technology. For example, the structures are built on wafers and are realized in films of material patterned by photolithographic processes on the top of a wafer. In particular, the fabrication of the circuit and a method for a zero test time memory using background built-in self-test uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
performing a functional write operation;
updating data of a test storage cache (TSC) when the functional write operation collides with a word under test (WUT);
performing a testing idle cycle when there is no collision between the functional write operation and the WUT;
testing a built-in self-test word under test (BIST WUT) with at least one pattern;
writing back the data from the TSC to the WUT after testing the BIST WUT;
verifying the data which is written back to the WUT;
removing a pointer of a translation lookaside buffer (TLB) to allow direct address mapping to the WUT after verifying the data which is written back to the WUT; and
incrementing a word address counter to test another word after removing the pointer,
wherein the testing the BIST WUT with at least one pattern occurs at a read/write port of a memory.

2. The method of claim 1, further comprising:
reading data of the WUT and storing the data of the WUT in the TSC after performing the functional write operation;
mapping the translation lookaside buffer (TLB) to point the WUT to the TSC after reading data of the WUT;
routing a plurality of WUT operations to the TSC after mapping the TLB; and
writing back the data of the WUT in the TSC to the WUT after routing the WUT operations.

3. The method of claim 2, removing the pointer of the TLB to allow direct address mapping to the WUT after performing the functional write operation.

4. The method of claim 2, wherein the translation lookaside buffer (TLB) stores translations of virtual memory to physical addresses for memory retrieval.

5. The method of claim 2, further comprising verifying the data of the WUT in the TSC after writing back the data of the WUT in the TSC to the WUT.

6. The method of claim 2, further comprising incrementing the word address counter to test a separate word after performing the functional write operation.

7. The method of claim 2, further comprising performing the testing idle cycle after updating data of the test storage cache (TSC) when the functional write operation collides with the word under test (WUT).

8. The method of claim 1, further comprising setting the WUT to zero.

9. The method of claim 1, wherein the word under test (WUT) comprises the data and an address.

10. The method of claim 1, wherein the testing the BIST WUT with at least one pattern occurs after the functional write operation is performed.

11. The method of claim 1, wherein the testing the BIST WUT with at least one pattern occurs before the functional write operation is performed.

12. The method of claim 1, wherein the at least one pattern comprises a checkerboard pattern.

13. The method of claim 1, wherein the at least one pattern comprises a reverse checkerboard pattern.

14. The method of claim 1, wherein the functional write operation is performed at the read/write port of the memory.

\* \* \* \* \*